US008398832B2

(12) United States Patent
Nulman et al.

(10) Patent No.: US 8,398,832 B2
(45) Date of Patent: *Mar. 19, 2013

(54) COILS FOR GENERATING A PLASMA AND FOR SPUTTERING

(75) Inventors: Jaim Nulman, Palo Alto, CA (US);
Sergio Edelstein, Los Gatos, CA (US);
Mani Subramani, San Jose, CA (US);
Zheng Xu, Foster City, CA (US);
Howard E. Grunes, Santa Cruz, CA (US); Avi Tepman, Cupertino, CA (US);
John C. Forster, San Francisco, CA (US); Praburam Gopalraja, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 481 days.

This patent is subject to a terminal disclaimer.

(21) Appl. No.: 11/229,139

(22) Filed: Sep. 15, 2005

(65) Prior Publication Data

US 2006/0070875 A1    Apr. 6, 2006

Related U.S. Application Data

(63) Continuation of application No. 10/896,155, filed on Jul. 20, 2004, now abandoned, which is a continuation of application No. 10/052,951, filed on Jan. 17, 2002, now Pat. No. 6,783,639, which is a continuation of application No. 08/851,946, filed on (Continued)

(51) Int. Cl.
*C23C 14/34* (2006.01)

(52) U.S. Cl. .............................. 204/298.06; 204/298.11

(58) Field of Classification Search ............. 204/298.06, 204/298.11
See application file for complete search history.

(56) References Cited

U.S. PATENT DOCUMENTS

| | | | |
|---|---|---|---|
| 3,594,301 | A | 7/1971 | Bruch |
| 3,619,402 | A | 11/1971 | Wurm et al. |
| 4,336,118 | A | 6/1982 | Patten et al. |
| 4,362,632 | A | 12/1982 | Jacob |
| 4,626,312 | A | 12/1986 | Tracy |
| 4,661,228 | A | 4/1987 | Mintz |
| 4,716,491 | A | 12/1987 | Ohno et al. |
| 4,792,732 | A | 12/1988 | O'Loughlin |
| 4,842,703 | A | 6/1989 | Class et al. |

(Continued)

FOREIGN PATENT DOCUMENTS

| | | |
|---|---|---|
| DE | 1905058 | 8/1970 |
| EP | 0520519 | 12/1992 |

(Continued)

OTHER PUBLICATIONS

Machine Translation of Japan 07-258840 dated Oct. 1995.*

(Continued)

*Primary Examiner* — Rodney McDonald
(74) *Attorney, Agent, or Firm* — Konrad Raynes Davda & Victor LLP

(57) ABSTRACT

A sputtering coil for a plasma chamber in a semiconductor fabrication system is provided. The sputtering coil couples energy into a plasma and also provides a source of sputtering material to be sputtered onto a workpiece from the coil to supplement material being sputtered from a target onto the workpiece. Alternatively a plurality of coils may be provided, one primarily for coupling energy into the plasma and the other primarily for providing a supplemental source of sputtering material to be sputtered on the workpiece.

25 Claims, 8 Drawing Sheets

Related U.S. Application Data

May 6, 1997, now Pat. No. 6,368,469, which is a continuation of application No. 08/680,335, filed on Jul. 10, 1996, now abandoned, which is a continuation-in-part of application No. 08/644,096, filed on May 10, 1996, now abandoned, which is a continuation-in-part of application No. 08/647,184, filed on May 9, 1996, now abandoned.

(56) References Cited

U.S. PATENT DOCUMENTS

| | | | |
|---|---|---|---|
| 4,844,775 | A | 7/1989 | Keeble |
| 4,865,712 | A | 9/1989 | Mintz |
| 4,871,421 | A | 10/1989 | Ogle et al. |
| 4,918,031 | A | 4/1990 | Flamm et al. |
| 4,925,542 | A | 5/1990 | Kidd |
| 4,941,915 | A | 7/1990 | Matsuoka et al. |
| 4,948,458 | A | 8/1990 | Ogle |
| 4,990,229 | A | 2/1991 | Campbell et al. |
| 4,999,096 | A | 3/1991 | Nihei et al. |
| 5,065,698 | A | 11/1991 | Koike |
| 5,091,049 | A | 2/1992 | Campbell et al. |
| 5,122,251 | A | 6/1992 | Campbell et al. |
| 5,135,629 | A | 8/1992 | Sawada et al. |
| 5,146,137 | A | 9/1992 | Gesche et al. |
| 5,175,608 | A | 12/1992 | Nihei et al. |
| 5,178,739 | A * | 1/1993 | Barnes et al. ............ 204/192.12 |
| 5,206,516 | A | 4/1993 | Keller et al. |
| 5,225,740 | A | 7/1993 | Ohkawa |
| 5,231,334 | A | 7/1993 | Paranjpe |
| 5,234,529 | A | 8/1993 | Johnson |
| 5,234,560 | A | 8/1993 | Kadlec et al. |
| 5,241,245 | A | 8/1993 | Barnes et al. |
| 5,280,154 | A | 1/1994 | Cuomo et al. |
| 5,304,279 | A | 4/1994 | Coultas et al. |
| 5,312,717 | A | 5/1994 | Sachdev et al. |
| 5,346,578 | A | 9/1994 | Benzing et al. |
| 5,361,016 | A | 11/1994 | Ohkawa et al. |
| 5,366,585 | A | 11/1994 | Robertson et al. |
| 5,366,590 | A | 11/1994 | Kadomura |
| 5,368,685 | A | 11/1994 | Kumihashi et al. |
| 5,397,962 | A | 3/1995 | Moslehi |
| 5,401,350 | A | 3/1995 | Patrick et al. |
| 5,404,079 | A | 4/1995 | Ohkuni et al. |
| 5,417,834 | A | 5/1995 | Latz |
| 5,418,431 | A | 5/1995 | Williamson et al. |
| 5,421,891 | A | 6/1995 | Campbell et al. |
| 5,429,070 | A | 7/1995 | Campbell et al. |
| 5,429,710 | A | 7/1995 | Akiba et al. |
| 5,429,995 | A | 7/1995 | Nishiyama et al. |
| 5,430,355 | A | 7/1995 | Paranjpe |
| 5,434,353 | A | 7/1995 | Kraus |
| 5,464,518 | A | 11/1995 | Sieck et al. |
| 5,503,676 | A | 4/1996 | Shufflebotham et al. |
| 5,560,776 | A | 10/1996 | Sugai et al. |
| 5,573,595 | A | 11/1996 | Dible |
| 5,589,224 | A | 12/1996 | Tepman et al. |
| 5,639,357 | A | 6/1997 | Xu |
| 5,690,781 | A | 11/1997 | Yoshida et al. |
| 5,763,851 | A | 6/1998 | Forster et al. |
| 5,803,977 | A | 9/1998 | Tepman et al. |
| 5,824,158 | A | 10/1998 | Takeuchi et al. |
| 5,908,489 | A | 6/1999 | Bludssus et al. |
| 5,951,775 | A | 9/1999 | Tepman |
| 5,961,793 | A | 10/1999 | Ngan |
| 6,023,038 | A | 2/2000 | van Gogh |
| 6,042,700 | A | 3/2000 | Gopalraja et al. |
| 6,077,402 | A | 6/2000 | Hong et al. |
| 6,210,539 | B1 | 4/2001 | Tanaka et al. |
| 6,228,229 | B1 | 5/2001 | Raaijmakers et al. |
| 6,235,169 | B1 | 5/2001 | Gopalraja et al. |
| 6,238,528 | B1 | 5/2001 | Xu et al. |
| 6,254,746 | B1 | 7/2001 | Subramani et al. |
| 6,254,748 | B1 | 7/2001 | Surampudi et al. |
| 6,264,812 | B1 | 7/2001 | Raaijmakers et al. |
| 6,297,595 | B1 | 10/2001 | Stimson et al. |
| 6,361,661 | B2 * | 3/2002 | Hong ....................... 204/192.12 |
| 6,368,469 | B1 * | 4/2002 | Nulman et al. .......... 204/192.12 |
| 6,375,810 | B2 | 4/2002 | Hong |
| 6,506,287 | B1 | 1/2003 | Ding |
| 6,514,390 | B1 | 2/2003 | Xu et al. |
| 6,579,426 | B1 | 6/2003 | van Gogh et al. |
| 6,652,717 | B1 | 11/2003 | Hong |
| 6,660,134 | B1 * | 12/2003 | Gopalraja et al. ....... 204/192.12 |
| 6,783,639 | B2 | 8/2004 | Nulman et al. |
| 2001/0019016 | A1 | 9/2001 | Subramani et al. |

FOREIGN PATENT DOCUMENTS

| | | |
|---|---|---|
| EP | 0601595 | 6/1994 |
| EP | 0607797 | 7/1994 |
| EP | 653 776 * | 5/1995 |
| EP | 0727807 | 8/1996 |
| EP | 0774886 | 5/1997 |
| EP | 0801413 | 10/1997 |
| EP | 0807954 | 11/1997 |
| GB | 2162365 | 1/1986 |
| GB | 2231197 | 11/1990 |
| JP | 56047562 | 4/1981 |
| JP | 59190363 | 10/1984 |
| JP | 61190070 | 8/1986 |
| JP | 63-14865 | 1/1988 |
| JP | 63246814 | 10/1988 |
| JP | 4-183855 | 6/1992 |
| JP | 6232055 | 8/1994 |
| JP | 6283470 | 10/1994 |
| JP | 7-188917 | 7/1995 |
| JP | 7176398 | 7/1995 |
| JP | 7176399 | 7/1995 |
| JP | 07-258840 * | 10/1995 |
| JP | 888190 | 4/1996 |
| JP | 8153712 | 6/1996 |
| JP | 8288259 | 11/1996 |
| JP | 10-60638 | 3/1998 |
| WO | 8606923 | 11/1986 |
| WO | WO8606923 | 11/1986 |
| WO | 9207969 | 5/1992 |
| WO | 9515672 | 6/1995 |

OTHER PUBLICATIONS

AT Search Report issued Nov. 19, 1999 in application SI9701437-7.

Holber, W.M., et al., "Copper Deposition by Electron Cyclotron Resonance Plasma," J. Vac. Sci. Technol., vol. A11, pp. 2903-2910, 1993.

Hopwood, J., et al., "Mechanisms for Highly Ionized Magnetron Sputtering," J. Appl. Phys., vol. 78, pp. 758-765, 1995.

Jiwari, N., et al., "Helicon wave plasma reactor employing single-loop antenna," J. of Vac. Sci. Technol., A 12(4), pp. 1322-1327, Jul./Aug. 1994.

Kidd, P., "A Magnetically Confined and ECR Heated Plasma Machine for Coating and Ion Surface Modification Use," J. Vac. Sci. Technol., vol. A9, pp. 466-473, 1991.

Kim, Y-W., et al., "Ionized Sputter Deposition of AlCu: Film Microstructure and Chemistry," J. Vac. Sci. Technol., vol. A12, pp. 3169-3175, 1994.

Matsuoka, M., et al., Dense Plasma Production and Film Deposition by New High-Rate Sputtering Using an Electric Mirror, J. Vac. Sci. Technol., A 7(4), 2652-2657, Jul./Aug. 1989.

Notice of Allowance for U.S. Appl. No. 10/052,951, dated Apr. 20, 2004, 13 pp.

Office Action 1 for U.S. Appl. No. 10/052,951, dated Jul. 22, 2003, 19 pp.

PCT Search Report issued in Appln PCT/US98/09739.

Response to Office Action 1 for U.S. Appl. No. 10/052,951, dated Nov. 19, 2003, 9 pp.

Rossnagel, S.M., "Directional and Ionized Sputter Deposition for Microelectronics Applications," Proc. of 3rd ISSP (Tokyo), pp. 253-260, 1995.

Rossnagel, S.M., et al., "Filling Dual Damascene Interconnect Structures with AlCu and Cu Using Ionized Magnetron Deposition," J. Vac. Sci. Technol., vol. B13, pp. 125-129, 1995.

Rossnagel, S.M., et al., "Magnetron Sputter Deposition with High Levels of Metal Ionization," Appl. Phys. Lett., vol. 63, pp. 3285-3287, 1993.
Rossnagel, S.M., et al., "Metal Ion Deposition from Ionized Magnetron Sputtering Discharge," J. Vac. Sci. Technol., vol. B12, pp. 449-453, 1994.
Search Report for Application No. EP96308251.6, dated Feb. 27, 1997.
Search Report for Application No. EP97303124.8, mailed Aug. 22, 1997.
U.S. Appl. No. 07/954,860, filed Sep. 30, 1992.
U.S. Appl. No. 08/644,096, filed May 10, 1996.
U.S. Appl. No. 08/647,182, filed May 9, 1996.
U.S. Appl. No. 08/647,184, filed May 9, 1996.
U.S. Appl. No. 08/677,588, filed Jul. 9, 1996.
U.S. Appl. No. 08/680,335, filed Jul. 10, 1996.
U.S. Appl. No. 08/907,382.
Yamashita, M., "Fundamental Characteristics of Built-in High Frequency Coil Type Sputtering Apparatus," J. Vac. Sci. Technol., vol. A7, pp. 151-158, 1989.
Yamashita, M., "Sputter Type High Frequency Ion Source for Ion Beam Deposition Apparatus," Jap. J. Appl. Phys., vol. 26, pp. 721-727, 1987.
Final Office Action 1 for U.S. Appl. No. 08/851,946, dated Dec. 12, 2000.
Notice of Allowance 1 for U.S. Appl. No. 08/851,946, dated May 3, 2001.
Notice of Allowance 2 for U.S. Appl. No. 08/851,946, dated Oct. 11, 2001.
Office Action 1 for U.S. Appl. No. 08/851,946, dated Jan. 19, 1999.
Office Action 2 for U.S. Appl. No. 08/851,946, dated Sep. 21, 1999.
Office Action 3 for U.S. Appl. No. 08/851,946, dated May 2, 2000.
Response to Final Office Action 1 for U.S. Appl. No. 08/851,946, dated Apr. 10, 2011.
Response to Office Action 1 for U.S. Appl. No. 08/851,946, dated Jun. 21, 1999.
Response to Office Action 2 for U.S. Appl. No. 08/851,946, dated Feb. 22, 2000.
Response to Office Action 3 for U.S. Appl. No. 08/851,946, dated Sep. 29, 2000.
Supplemental Response to Office Action 1 for U.S. Appl. No. 08/851,946, dated Jun. 23, 1999.
Abstract and Machine Translation for JP Publication No. 07018433, Jan. 20, 1995, 13 pp.
Abstract and Machine Translation for JP Publication No. 10055983, Feb. 24, 1998, 33 pp.
Final Office Action 1 for JP Application No. 09-155665, dated Nov. 10, 2009, 7 pp. [with Engl Trans].
Notice of Allowance 1 for JP Application No. 09-155665, dated Jun. 16, 2010, 8 pp. [with Engl Trans of Allowed Claims].
Office Action 1 for KR Application No. 10-2004-0099101, dated Apr. 29, 2005, 7 pp. [With Engl Trans].
Response to Final Office Action 1 for JP Application No. 09-155665, dated Apr. 19, 2010, 12 pp. [with Engl Trans of Amended Claims].
Voluntary Amendment for JP Application No. 2008-153424, dated Apr. 28, 2010, 15 pp. [with Engl Trans of Amended Claims].
Notification of Reason for Rejection for JP Application No. 2008-153424, dated Jul. 28, 2011, 7 pp.
Machine Translation of JP7-188917, published on Jul. 25, 1995, 16 pp.
Response to Office Action 1 for JP Application No. 2008-153424, dated Jan. 27, 2012, 19 pp.
Office Action 2 (with Provisional Report) for JP Application No. 2008-153424, dated Oct. 11, 2012, 4 pp.

* cited by examiner

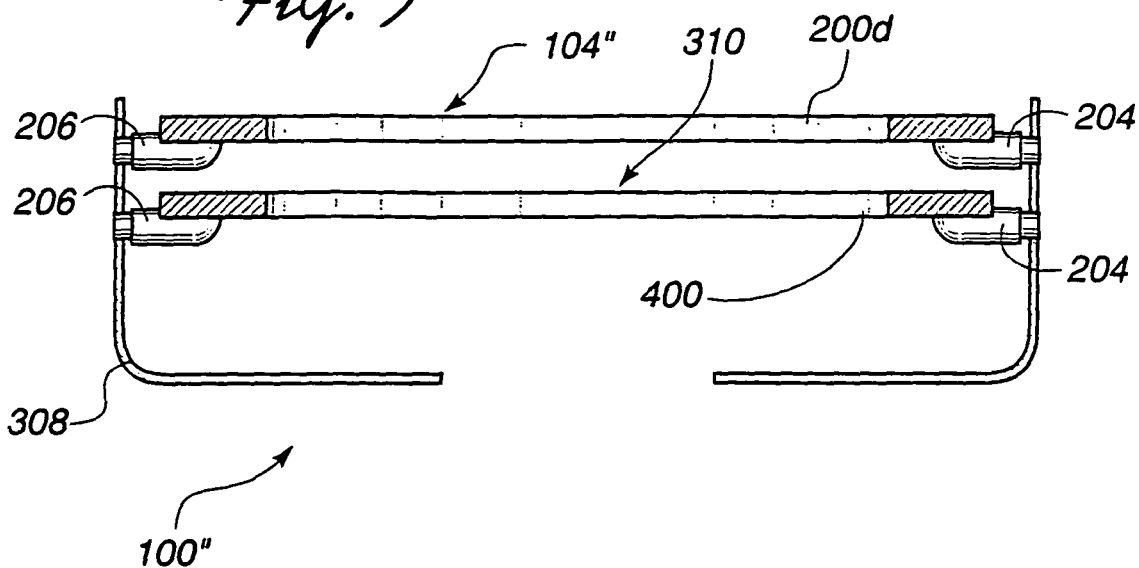
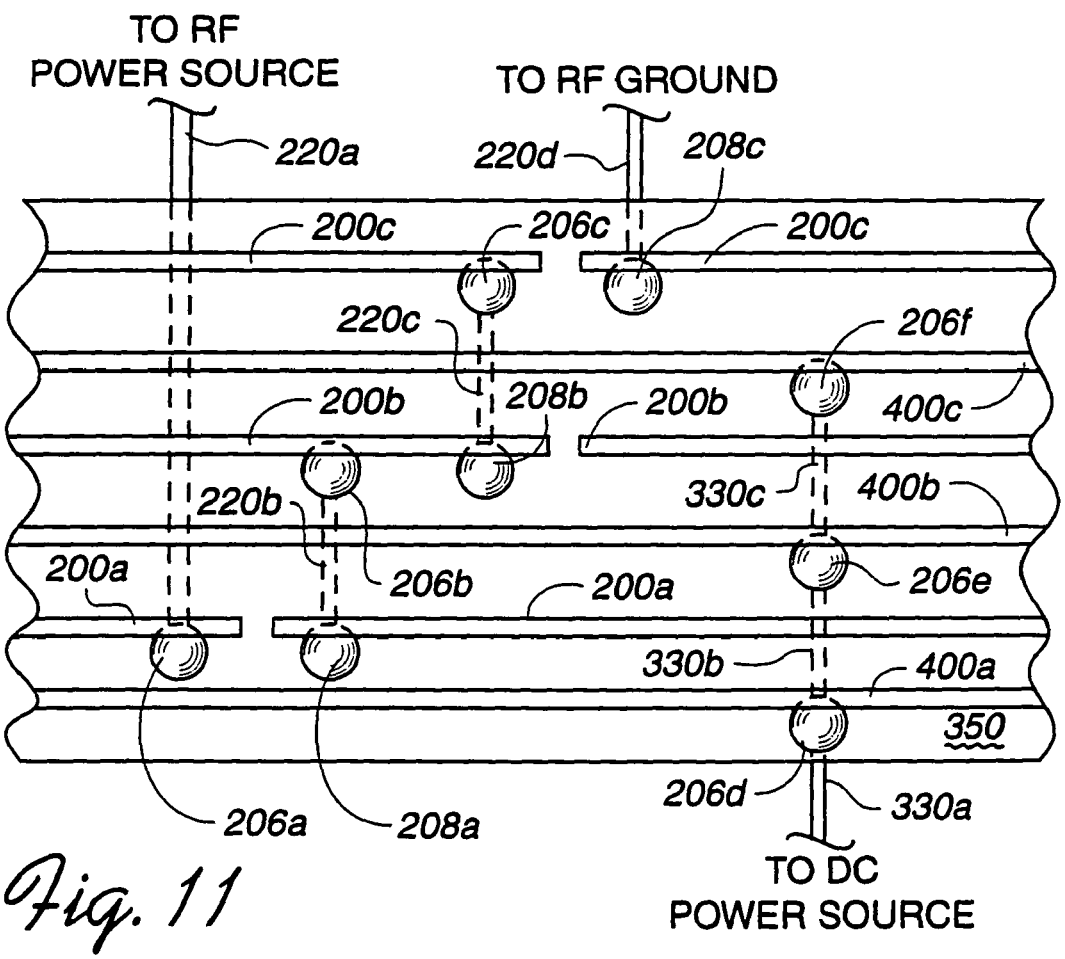

COILS FOR GENERATING A PLASMA AND FOR SPUTTERING

RELATED APPLICATIONS

This application is a continuation of application Ser. No. 10/896,155 filed Jul. 20, 2004 and now abandoned, which is a continuation of application Ser. No. 10/052,951 filed Jan. 17, 2002, now issued as U.S. Pat. No. 6,783,639; which is a continuation of Ser. No. 08/851,946 filed May 6, 1997, now issued as U.S. Pat. No. 6,368,469; which is a continuation of application Ser. No. 08/680,335 filed Jul. 10, 1996 and now abandoned; which is a continuation-in-part of application Ser. No. 08/644,096 filed May 10, 1996 and now abandoned; which is a continuation-in-part of application Ser. No. 08/647,184 filed May 9, 1996 and now abandoned.

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In many high density plasma applications, it is preferable for the chamber to be operated at a relatively high pressure so that the frequency of collisions between the plasma ions and the deposition material atoms is increased to increase thereby the resident time of the sputtered material in the high density plasma zone. However, scattering of the deposition atoms is likewise increased. This scattering of the deposition atoms typically causes the thickness of the deposition layer on the substrate to be thicker on that portion of the substrate aligned with the center of the target and thinner in the outlying regions. It has been found that the deposition layer can be made more uniform by reducing the distance between the target and the substrate which reduces the effect of the plasma scattering.

On the other hand, in order to increase the ionization of the plasma to increase the sputtering rate and the ionization of the sputtered atoms, it has been found desirable to increase the distance between the target and the substrate. The coil which is used to couple energy into the plasma typically encircles the space between the target and the substrate. If the target is positioned too closely to the substrate, the ionization of the plasma can be adversely affected. Thus, in order to accommodate the coil which is coupling RF energy into the plasma, it has often been found necessary to space the target from the substrate a certain minimum distance even though such a minimum spacing can have an adverse effect on the uniformity of the deposition.

SUMMARY OF THE PREFERRED EMBODIMENTS

It is an object of the present invention to provide an improved method and apparatus for generating a plasma within a chamber and for sputter depositing a layer which obviate, for practical purposes, the above-mentioned limitations.

These and other objects and advantages are achieved by, in accordance with one aspect of the invention, a plasma generating apparatus which inductively couples electromagnetic energy from a coil which is also adapted to sputter material from the coil onto the workpiece to supplement the material being sputtered from a target onto the workpiece. The coil is preferably made of the same type of material as the target so that the atoms sputtered from the coil combine with the atoms sputtered from the target to form a layer of the desired type of material. It has been found that the distribution of material sputtered from a coil in accordance with one embodiment of the present invention tends to be thicker at the edges of the substrate and thinner toward the center of the substrate. Such a distribution is very advantageous for compensating for the distribution profile of material sputtered from a target in which the material from the target tends to deposit more thickly in the center of the substrate as compared to the edges. As a consequence, the materials deposited from both the coil and the target can combine to form a layer of relatively uniform thickness from the center of the substrate to its edges.

In one embodiment, both the target and the coil are formed from relatively pure titanium so that the material sputtered onto the substrate from both the target and the coil is substantially the same material, that is, titanium. In other embodiments, other types of materials may be deposited such as aluminum. In which case, the coil as well as the target would be made from the same grade of aluminum, i.e., target grade aluminum. If it is desired to deposit a mixture or combination of materials, the target and the coil can be formed from the same mixture of materials or alternatively from different materials such that the materials combine or mix when deposited on the substrate.

In yet another embodiment, a second coil-like structure in addition to the first coil, provides a supplemental target for sputtering material. This second coil is preferably not coupled to an RF generator but is instead biased with DC power. Although material may or may not continue to be sputtered from the first coil, sputtered material from the coils will originate primarily from the second coil because of its DC biasing. Such an arrangement permits the ratio of the DC bias of the primary target to the DC bias of the second coil to be set to optimize compensation for non-uniformity in thickness of the material being deposited from the primary target. In addition, the RF power applied to the first coil can be set independently of the biases applied to the target and the second coil for optimization of the plasma density for ionization.

BRIEF DESCRIPTION OF THE DRAWINGS

FIG. 9 is a schematic partial cross-sectional view of a plasma generating chamber in accordance with another embodiment of the present invention utilizing dual coils, one of which is RF powered for plasma generation and the other of which is DC biased to provide a supplemental target.

FIG. 11 illustrates a plurality of coil ring feedthrough standoffs for a plasma generating chamber having two multiple ring coils in which the rings of the two coils are interleaved.

DETAILED DESCRIPTION OF THE DRAWINGS

Figure 1:
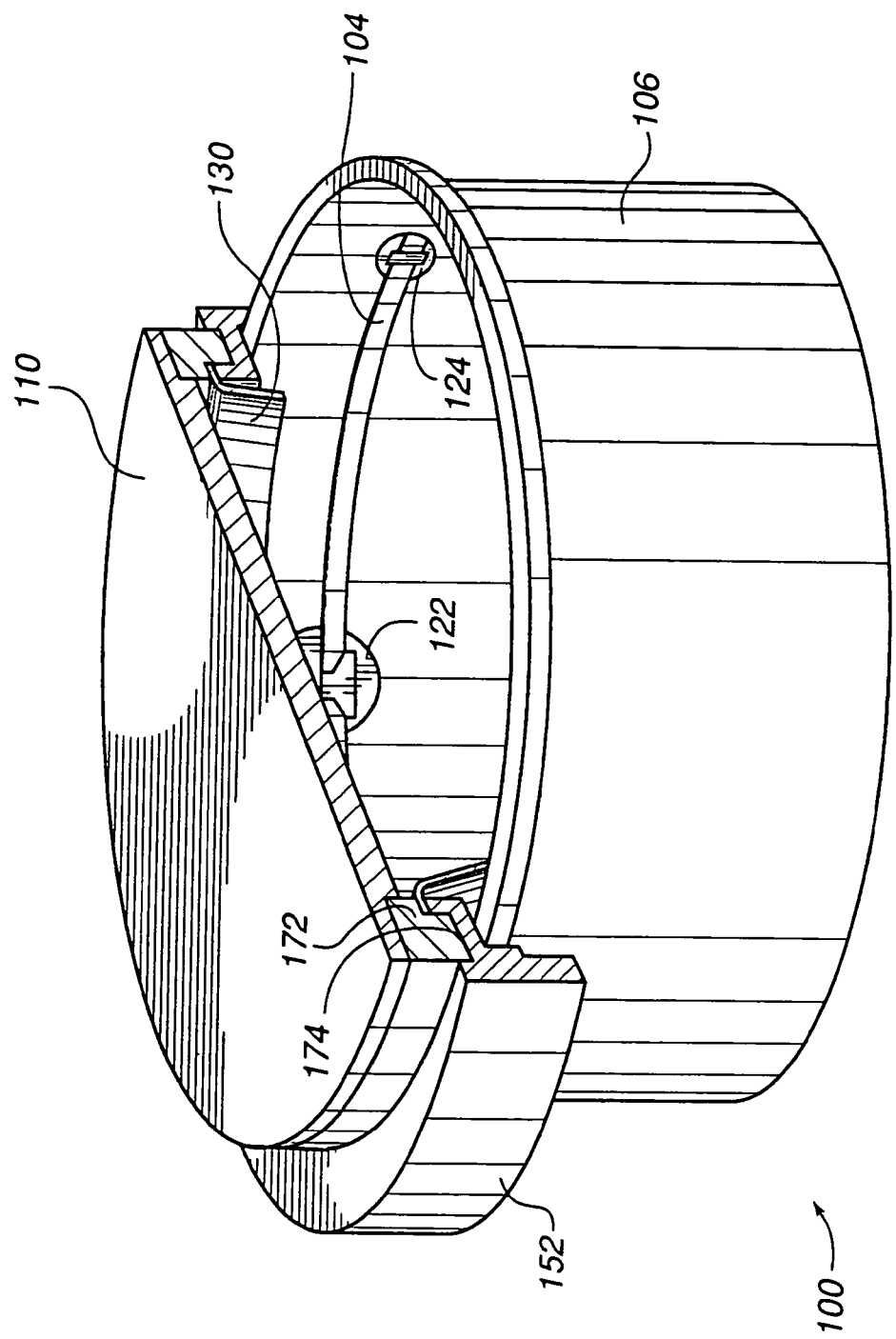
FIG. 1 is a perspective, partial cross-sectional view of a plasma generating chamber in accordance with one embodiment of the present invention.
Figure 2:
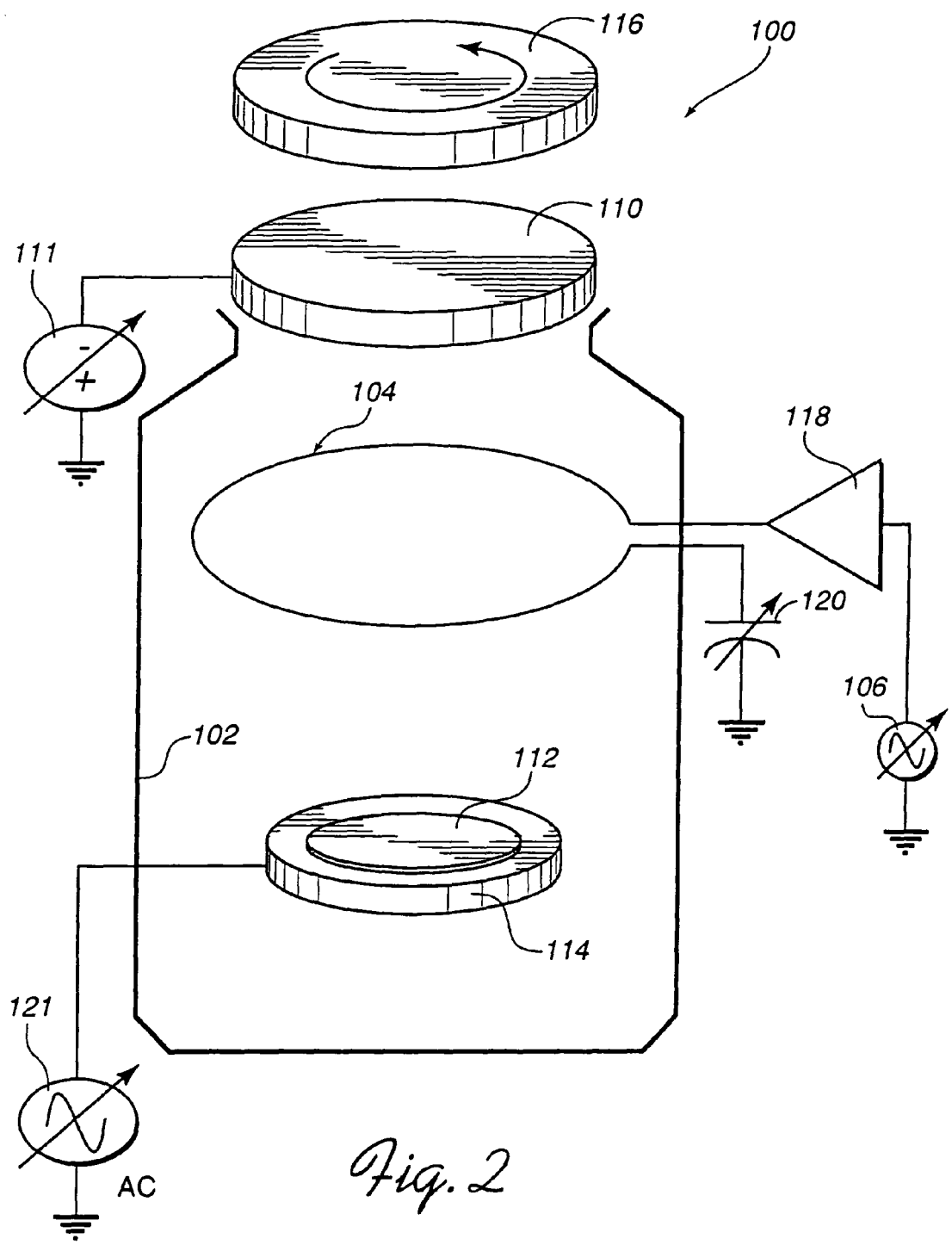
FIG. 2 is a schematic diagram of the electrical interconnections to the plasma generating chamber of FIG. 1.

Referring first to FIGS. 1 and 2, a plasma generator in accordance with a first embodiment of the present invention comprises a substantially cylindrical plasma chamber 100 which is received in a vacuum chamber 102 (shown schematically in FIG. 2). The plasma chamber 100 of this embodiment has a single turn coil 104 which is carried internally by a shield 106. The shield 106 protects the interior walls (not shown) of the vacuum chamber 102 from the material being deposited within the interior of the plasma chamber 100.

Radio frequency (RF) energy from an RF generator 106 is radiated from the coil 104 into the interior of the deposition system 100, which energizes a plasma within the deposition system 100. The energized plasma produces a plasma ion flux which strikes a negatively biased target 110 positioned at the top of the chamber 102. The target 110 is negatively biased by a DC power source 111. The plasma ions eject material from the target 110 onto a substrate 112 which may be a wafer or other workpiece which is supported by a pedestal 114 at the bottom of the deposition system 100. A rotating magnet assembly 116 provided above the target 110 produces magnetic fields which sweep over the face of the target 110 to promote uniform erosion of the target.

The atoms of material ejected from the target 110 are in turn ionized by the plasma being energized by the coil 104 which is inductively coupled to the plasma. The RF generator 106 is preferably coupled to the coil 104 through an amplifier and impedance matching network 118. The other end of the coil 104 is coupled to ground, preferably through a capacitor 120 which may be a variable capacitor. The ionized deposition material is attracted to the substrate 112 and forms a deposition layer thereon. The pedestal 114 may be negatively biased by an AC (or DC or RF) source 121 so as to externally bias the substrate 112. As set forth in greater detail in application Ser. No. 08/677,588, entitled "Method for Providing Full-Face High Density Plasma Deposition" filed Jul. 9, 1996, and now abandoned, which is assigned to the assignee of the present application and is incorporated herein by reference in its entirety, external biasing of the substrate 112 may optionally be eliminated.

As will be explained in greater detail below, in accordance with one aspect of the present invention, material is also sputtered from the coil 104 onto the substrate 112 to supplement the material which is being sputtered from the target 110 onto the workpiece. As a result, the layer deposited onto the substrate 112 is formed from material from both the coil 104 and the target 110 which can substantially improve the uniformity of the resultant layer.

The coil 104 is carried on the shield 106 by a plurality of coil standoffs 122 (FIG. 1) which electrically insulate the coil 104 from the supporting shield 106. As set forth in greater detail in copending application Ser. No. 08/647,182, entitled "Recessed Coil for Generating a Plasma," filed May 9, 1996 and now abandoned, which is assigned to the assignee of the present application, which application is incorporated herein by reference in its entirety, the insulating coil standoffs 122 have an internal labyrinth structure which permits repeated deposition of conductive materials from the target 110 onto the coil standoffs 122 while preventing the formation of a complete conducting path of deposited material from the coil 104 to the shield 106 which could short the coil 104 to the shield 106 (which is typically at ground).

RF power is applied to the coil 104 by feedthroughs (not shown) which are supported by insulating feedthrough standoffs 124. The feedthrough standoffs 124, like the coil support standoffs 122, permit repeated deposition of conductive material from the target onto the feedthrough standoff 124 without the formation of a conducting path which could short the coil 104 to the shield 106. Thus, the coil feedthrough standoff 124 has an internal labyrinth structure somewhat similar to that of the coil standoff 122 to prevent the formation of a short between the coil 104 and the wall 140 of the shield.

As best seen in FIG. 1, the plasma chamber 100 has a dark space shield ring 130 which provides a ground plane with respect to the target 110 above which is negatively biased. In addition, as explained in greater detail in the aforementioned copending application Ser. No. 08/647,182, the shield ring 130 shields the outer edges of the target from the plasma to reduce sputtering of the target outer edges. The dark space shield 130 performs yet another function in that it is positioned to shield the coil 104 (and the coil support standoffs 122 and feedthrough standoffs 124) from the material being sputtered from the target 110. The dark space shield 130 does not completely shield the coil 104 and its associated supporting structure from all of the material being sputtered since some of the sputtered material travels at an oblique angle with respect to the vertical axis of the plasma chamber 100. However, because much of the sputtered material does travel parallel to the vertical axis of the chamber or at relatively small oblique angles relative to the vertical axis, the dark space shield 130 which is positioned in an overlapping fashion above the coil 104, prevents a substantial amount of sputtered material from being deposited on the coil 104. By reducing the amount of material that would otherwise be deposited on the coil 104, the generation of particles by the material which is deposited on the coil 104 (and its supporting structures) can be substantially reduced.

In the illustrated embodiment, the dark space shield 130 is a closed continuous ring of titanium (where titanium deposition is occurring in the chamber 100) or stainless steel having a generally inverted frusto-conical shape. The dark space shield extends inward toward the center of plasma chamber 100 so as to overlap the coil 104 by a distance of ¼ inch. It is recognized, of course, that the amount of overlap can be varied depending upon the relative size and placement of the coil and other factors. For example, the overlap may be increased to increase the shielding of the coil 104 from the sputtered material but increasing the overlap could also further shield the target from the plasma which may be undesirable in some applications. In an alternative embodiment, the coil 104 may be placed in a recessed coil chamber (not shown) to further protect the coil and reduce particle deposits on the workpiece.

The chamber shield 106 is generally bowl-shaped and includes a generally cylindrically shaped, vertically oriented wall 140 to which the standoffs 122 and 124 are attached to insulatively support the coil 104. The shield further has a generally annular-shaped floor wall (not shown) which surrounds the chuck or pedestal 114 which supports the workpiece 112 which has an 8" diameter in the illustrated embodiment. A clamp ring (not shown) may be used to clamp the wafer to the chuck 114 and cover the gap between the floor wall of the shield 106 and the chuck 114.

The plasma chamber 100 is supported by an adapter ring assembly 152 which engages the vacuum chamber. The chamber shield 106 is grounded to the system ground through the adapter ring assembly 152. The dark space shield 130, like the chamber shield 106, is grounded through the adapter ring assembly 152.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 152. The insulator ring assembly 172 which may be made of a variety of insulative materials including ceramics spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber to the target 110.

The coil 104 of the illustrated embodiment is made of ½ by ⅛ inch heavy duty bead blasted solid high-purity (preferably 99.995% pure) titanium ribbon formed into a single turn coil having a diameter of 10-12 inches. However, other highly conductive materials and shapes may be utilized depending upon the material being sputtered and other factors. For example, the ribbon may be as thin as 1/16 inch and exceed 2 inches in height. Also, if the material to be sputtered is aluminum, both the target and the coil may be made of high purity aluminum. In addition to the ribbon shape illustrated, hollow tubing may be utilized, particularly if water cooling is desired.

Figure 3:
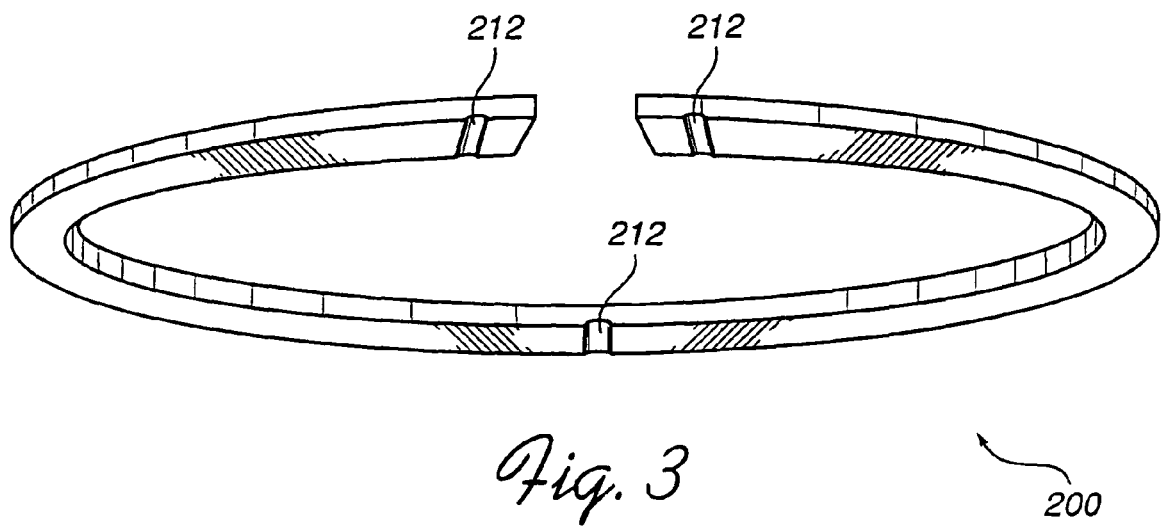
FIG. 3 is a perspective view of a coil ring for a plasma generating apparatus in accordance with another embodiment of the present invention.
Figure 4:
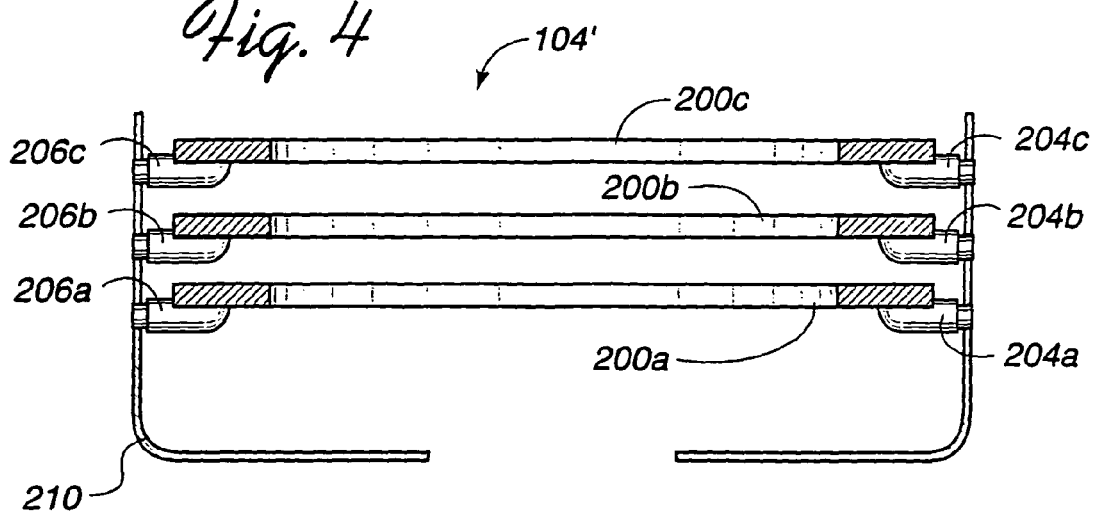
FIG. 4 is a schematic partial cross-sectional view of a plasma generating chamber in accordance with another embodiment of the present invention utilizing a coil ring as shown in FIG. 3.
Figure 5:
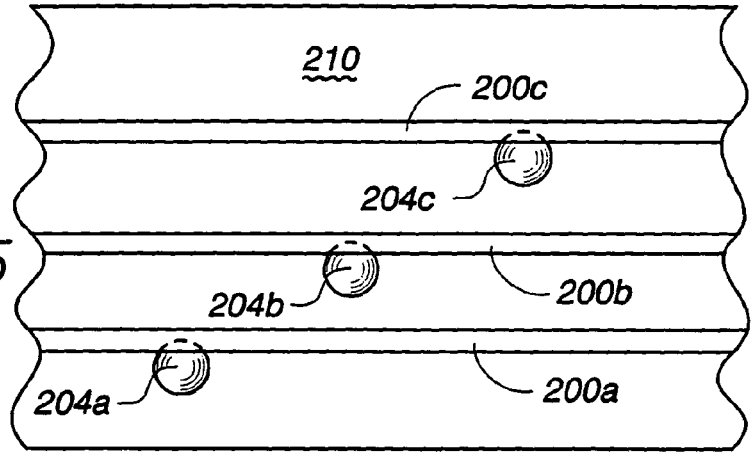
FIG. 5 illustrates a plurality of coil ring support standoffs for the plasma generating chamber of FIG. 4.

Still further, instead of the ribbon shape illustrated, each turn of the coil, where the coil has multiple turns, may be implemented with a flat, open-ended annular ring such as that illustrated at 200 in FIG. 3. Such an arrangement is particularly advantageous for multiple turn coils. The advantage of a multiple turn coil is that the required current levels can be substantially reduced for a given RF power level. However, multiple turn coils tend to be more complicated and hence most costly and difficult to clean as compared to single turn coils. For example, a three turn helical coil of titanium and its associated supporting structure could be quite expensive. The cost of manufacture of a multiple turn coil can be substantially reduced by utilizing several such flat rings 200a-200c to form a multiple turn coil 104' as illustrated in FIG. 4. Each ring is supported on one side by a support standoff 204a-204c and a pair of RF feedthrough standoffs 206a-206c and 208a-208c (FIG. 6) on the other side. As best seen in FIG. 5, the support standoffs 204a-204c are preferably positioned on the shield wall 210 in a staggered relationship. Each support standoff 204a-204c is received by a corresponding groove 212 (FIG. 3) formed in the underside of the corresponding coil ring 200 to secure the coil ring in place.

Figure 6:
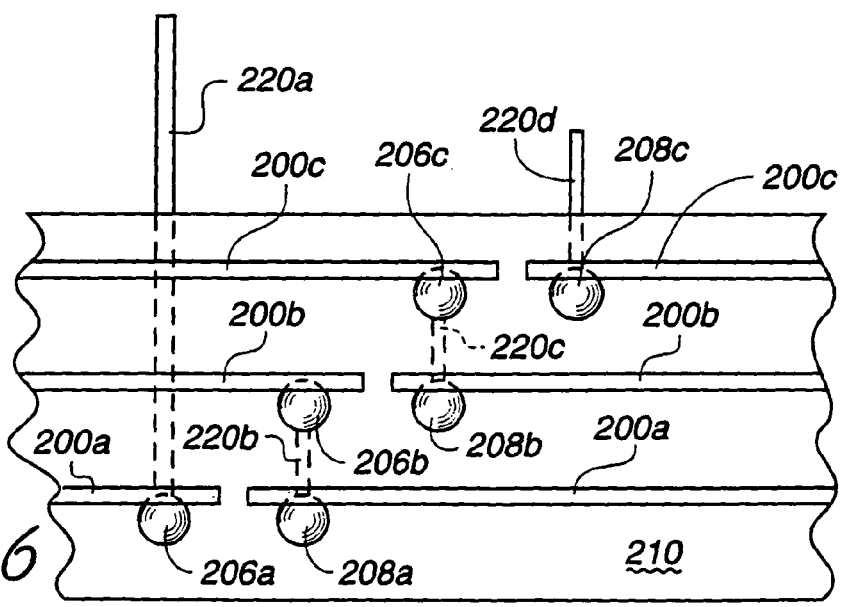
FIG. 6 illustrates a plurality of coil ring feedthrough standoffs for the plasma generating chamber of FIG. 4.

The coil rings 200a-200c are electrically connected together in series by RF feedthroughs which pass through the RF feedthrough standoffs 206a-206c and 208a-208c. In the same manner as the support standoffs 204a-204c, the feedthrough standoffs 206a-206c and 208a-208c are each received in a corresponding groove 212 (FIG. 3) formed in the underside of each coil ring adjacent each end of the coil ring. As schematically represented in FIG. 6, an RF waveguide 220a external to the shield wall is coupled by the RF feedthrough in feedthrough standoff 206a to one end of the lowest coil ring 200a. The other end of the coil ring 200a is coupled by the RF feedthrough in feedthrough standoff 208a to another external RF waveguide 220b which is coupled by the RF feedthrough in feedthrough standoff 206b to one end of the middle coil ring 200b. The other end of the coil ring 200b is coupled by the RF feedthrough in feedthrough standoff 208b to another external RF waveguide 220c which is coupled by the RF feedthrough in feedthrough standoff 206c to one end of the top coil ring 200c. Finally, the other end of the top coil ring 200c is coupled by the RF feedthrough in feedthrough standoff 208c to another external RF waveguide 220d. Coupled together in this manner, it is seen that the currents through the coil rings 200a-200c will be directed in the same direction such that the magnetic fields generated by the coil rings will constructively reinforce each other. Because the coil 104' is a multiple turn coil, the current handling requirements of the feedthrough supports 206 and 208 can be substantially reduced as compared to those of the feedthrough supports 124 of the single turn coil 104 for a given RF power level.

Figure 7:
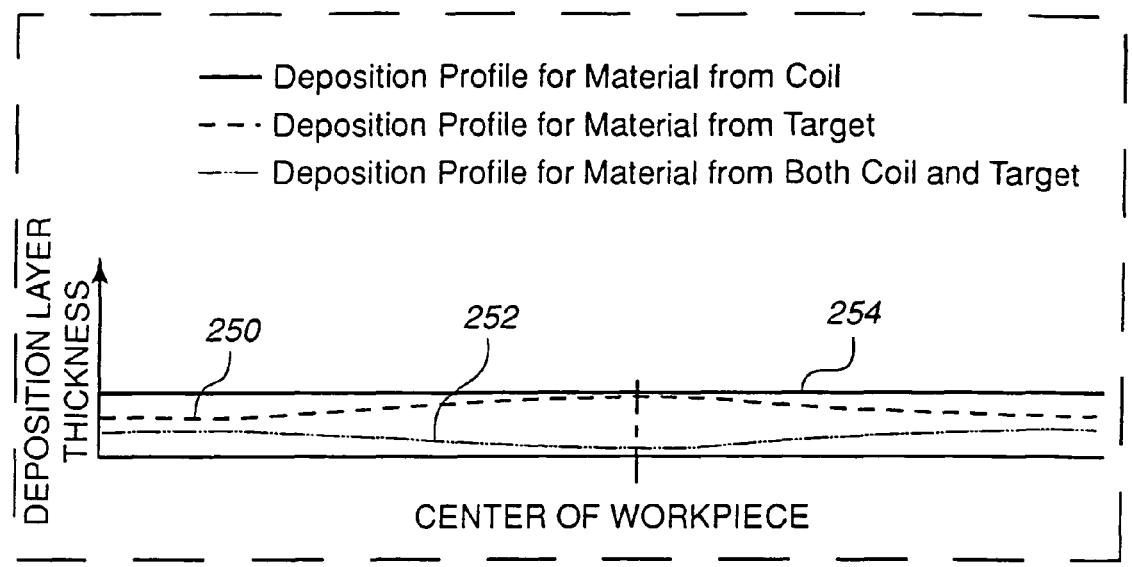
FIG. 7 is a chart depicting the respective deposition profiles for material deposited from the coil and the target of the apparatus of FIG. 1.

As previously mentioned, in order to accommodate the coil 104 to facilitate ionization of the plasma, it has been found beneficial to space the target 110 from the surface of the workpiece 112. However, this increased spacing between the target and the workpiece can adversely impact the uniformity of the material being deposited from the target. As indicated at 250 in FIG. 7, such nonuniformity typically exhibits itself as a thickening of the deposited material toward the center of the workpiece with a consequent thinning of the deposited material toward the edges of the workpiece. In accordance with one feature of the present invention, this nonuniformity can be effectively compensated by sputtering deposition material not only from the sputter target 110 above the workpiece but also from the coil 104 encircling the edges of the workpiece. Because the edges of the workpiece are closer to the coil 104 than is the center of the workpiece, it has been found that the material sputtered from the coil tends to deposit more thickly toward the edges of the workpiece than the center, as indicated at 252 in FIG. 3. This is of course the reverse of the deposition pattern of material from the target 110. By appropriately adjusting the ratio of RF power level applied to the coil 104 to the DC power level of the bias applied to the target, it has been found that the deposition level of the material being sputtered from the coil 104 can be selected in such a manner as to compensate substantially for the nonuniformity of the deposition profile of the material from the target such that the overall deposition profile of the layer from both sources of sputtered material as indicated by the deposition profile 254 in FIG. 7 can be substantially more uniform than that which has often been obtained from the target alone. It is preferred that the coil supply sufficient sputtered material such that the material sputtered from the coil be deposited at a rate of at least 50 Å per minute as measured at the edge of the wafer in addition to that material being sputtered from the target and deposited on the wafer.

Figure 8:
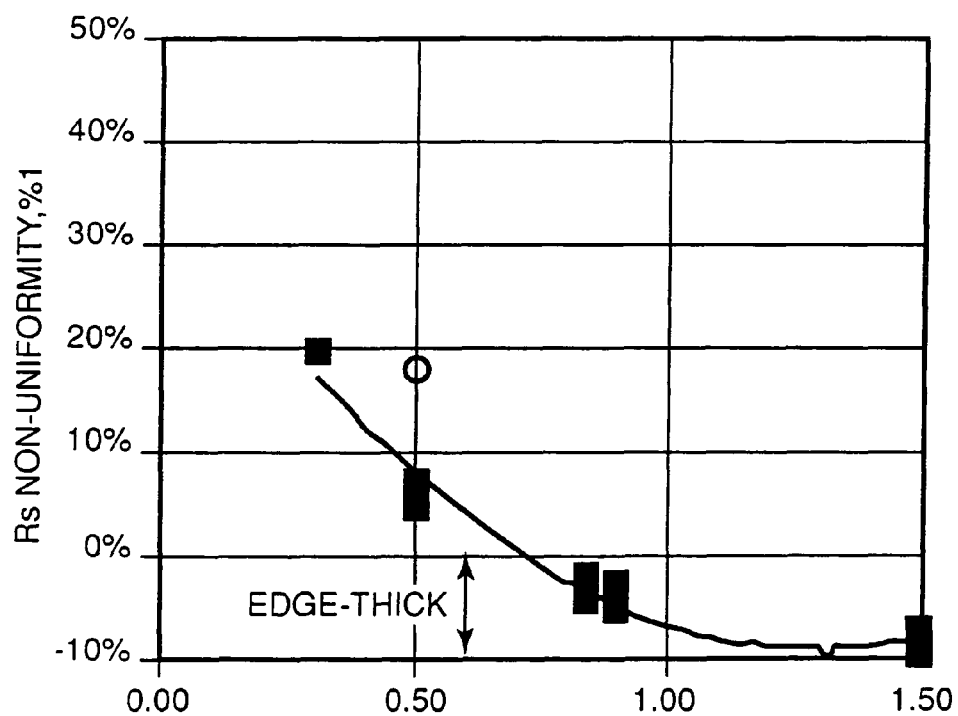
FIG. 8 is a graph depicting the effect on deposition uniformity of the ratio of the RF power applied to the coil relative to the DC power bias of the target.

It is presently believed that the amount of sputtering which originates from the coil 104 as compared to the sputtering which originates from the target 110 is a function of the RF power applied to the coil 104 relative to the DC power applied to the target 110. By adjusting the ratio of the coil RF power to the target DC power, the relative amounts of material sputtered from the coil 104 and the target 110 may be varied so as to achieve the desired uniformity. As shown in FIG. 8, it is believed that a particular ratio of the coil RF power to the target DC power will achieve the smallest degree (represented as 0%) of non-uniformity of the layer of material deposited from both the coil and the target. As the RF power to the coil is increased relative to the DC power applied to the target, the deposited layer tends to be more edge thick as represented by the increasingly negative percentage of non-uniformity as shown in FIG. 8. (In the sign convention of FIG. 8, an edge thick non-uniformity was chosen to be represented by a negative percentage of non-uniformity and a center thick non-uniformity was chosen to be represented by a positive percentage of non-uniformity. The larger the absolute value of the percentage non-uniformity, the greater the degree of nonuniformity (either edge thick or center thick) represented by that percentage. Conversely, by decreasing the ratio of the RF power to the coil relative to the DC power applied to the target, the center of the deposited layer tends to grow increasingly thicker relative to the edges as represented by the increasingly positive percentage of non-uniformity. Thus, by adjusting the ratio of the RF power to the coil relative to the DC power biasing the target, the material being sputtered from the coil can be increased or decreased as appropriate to effectively compensate for non-uniformity of the material being deposited from the target to achieve a more uniform deposited layer comprising material from both the target and the coil. For the single turn coil 104, a coil RF power to target DC power ratio of approximately 1.5 has been found to provide satisfactory results on an 8 inch diameter wafer. FIG. 8 depicts the results of varying coil RF power to target DC power for a three turn coil in which a ratio of approximately 0.7 is indicated as being optimal.

It is further believed that the relative amounts of sputtering between the coil and the target may also be a function of the DC biasing of the coil 104 relative to that of the target 110. This DC biasing of the coil 104 may be adjusted in a variety of methods. For example, the matching network 302 typically includes inductors and capacitors. By varying the capacitance of one or more capacitors of the matching network, the DC biasing of the coil 104 might be adjusted to achieve the desired level of uniformity. In one embodiment, the RF power to the coil and the DC biasing of the coil 104 may have separate adjustment inputs to achieve the desired results. An alternative power arrangement could include two RF generators operated at slightly different frequencies. The output of one generator would be coupled to the coil in the conventional manner but the other generator at the slightly different frequency would be capacitively coupled to the coil such that a change in the power level of the second generator would change the DC bias of the coil. Such an arrangement could provide independent control of the RF power and DC bias applied to the coil. At present, it is believed that relatively large changes in DC bias to the coil for a given RF power level would be necessary to have a substantial effect on the amount of material sputtered from the coil.

Each of the embodiments discussed above utilized a single coil in the plasma chamber. It should be recognized that the present invention is applicable to plasma chambers having more than one RF powered coil. For example, the present invention may be applied to multiple coil chambers for launching helicon waves of the type described in copending application Ser. No. 08/559,345.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 100 MHz. An RF power setting of 4.5 kW is preferred but a range of 1.5-5 kW is believed to be satisfactory. In some applications, energy may also be transferred to the plasma by applying AC or DC power to coils and other energy transfer members. A DC power setting for biasing the target 110 of 3 kW is preferred but a range of 2-5 kW and a pedestal bias voltage of −30 volts DC is believed to be satisfactory for many applications.

In the illustrated embodiment, the shield 106 has a diameter of 13½" but it is anticipated that good results can be obtained so long as the shield has a diameter sufficient to extend beyond the outer diameter of the target, the substrate support and substrate, to shield the chamber from the plasma. The shields may be fabricated from a variety of materials including insulative materials such as ceramics or quartz. However, the shield and all metal surfaces likely to be coated with the target material are preferably made of the same material as the sputtered target material but may be made of a material such as stainless steel or copper. The material of the structure which will be coated should have a coefficient of thermal expansion which closely matches that of the material being sputtered to reduce flaking of sputtered material from the shield or other structure onto the wafer. In addition, the material to be coated should have good adhesion to the sputtered material. Thus for example if the deposited material is titanium, the preferred metal of the shields, brackets and other structures likely to be coated is bead blasted titanium. Any surfaces which are more likely to sputter such as the end caps of the coil support and feed through standoffs would preferably be made of the same type of material as the target such as high purity titanium, for example. Of course, if the material to be deposited is a material other than titanium, the preferred metal is the deposited material, stainless steel or copper. Adherence can also be improved by coating the structures with molybdenum prior to sputtering the target. However, it is preferred that the coil (or any other surface likely to sputter) not be coated with molybdenum or other materials since the molybdenum can contaminate the workpiece if sputtered from the coil.

The wafer to target space is preferably about 140 mm but can range from about 1.5" to 8". For this wafer to target spacing, satisfactory coverage, i.e., the ratio of aperture bottom deposition thickness to field deposition thickness, has been achieved with a coil diameter of about 11½ inches spaced from the target by a distance of about 2.9 inches. It has been found that increasing the diameter of the coil which moves the coil away from the workpiece edge has an adverse effect on bottom coverage. On the other hand, decreasing the coil diameter to move the coil closer to the wafer edge can adversely effect layer uniformity. It is believed that decreasing the coil diameter causes the coil to be more closely aligned with the target resulting in substantial deposition of material from the target onto the coil which in turn can adversely effect the uniformity of material being sputtered from the coil.

Deposition uniformity also appears to be a function of coil spacing from the target. As previously mentioned, a spacing of about 2.9 inches between the coil and target has been found satisfactory for a target to wafer spacing of 140 mm. Moving the coil vertically either toward or away from the target (or wafer) can adversely effect deposition layer uniformity.

Figure 10:
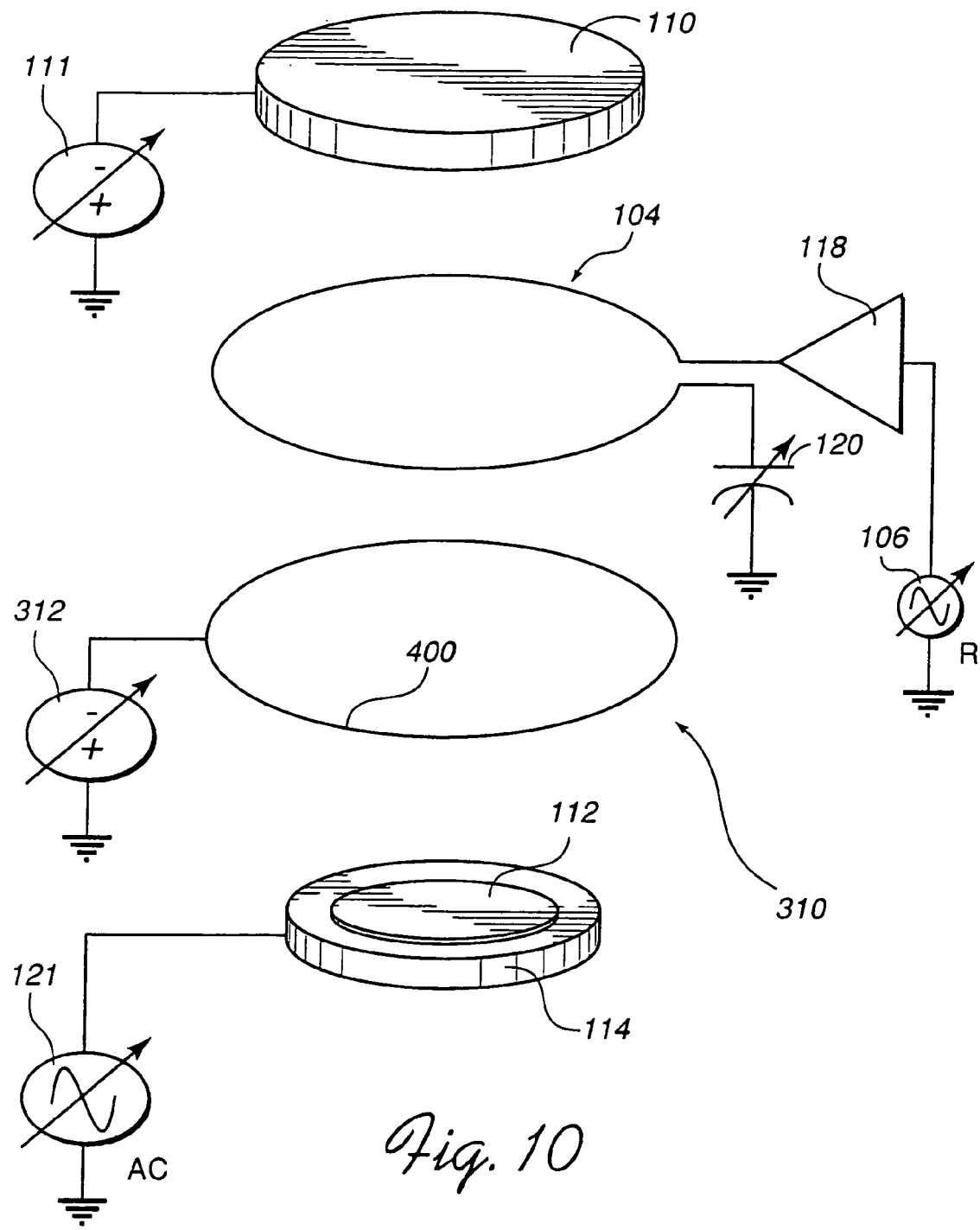
FIG. 10 is a schematic diagram of the electrical interconnections to the plasma generating chamber of FIG. 10.

As set forth above, the relative amounts of material sputtered from the target 110 and the coil 104 are a function of the ratio of the RF power applied to the coil and the DC power applied to the target. However, it is recognized that in some applications, an RF power level which is optimum for improving the uniformity of the deposited layer of materials from the coil and the target may not be optimum for generating a plasma density for ionization. FIG. 9 illustrates an alternative embodiment of a plasma chamber 100" having a coil 104" formed of a single open ended coil ring 200d of the type depicted in FIG. 3. As shown in FIG. 10, the coil 104" is coupled through the shield 308 by feedthrough standoffs 206 to a matching network 118 and an RF generator 106 in the same manner as the coils 104 and 104' described above. However, the chamber 100" has a second target 310 which, although generally shaped like a coil, is not coupled to an RF generator. Instead, the second target 310 formed of a flat closed ring 400 is coupled through feedthrough standoffs 206 to a variable negative DC bias source 312 as shown in FIG. 10. As a consequence, the chamber has three "targets," the first and second targets 110 and 310, respectively, as well as the RF coil 104". However, most of the material sputtered from the coil 104" and the second target 310 originates from the DC biased target 310 rather than the RF powered coil 104".

Such an arrangement has a number of advantages. Because most of the material sputtered from the coils originates from the second target 310 rather than the coil 104", the relative amounts of material being sputtered from the coil 104" and the first and second targets 110 and 310 are a function primarily of the relative DC power biasing the target 310 and the target 110. Hence the variable DC power sources 111 and 312 biasing the first target 110 and the second target 310, respectively, can be set to optimize the uniformity of the deposition of material more independently of the RF power setting for the RF generator 106 powering the coil 104". Conversely, the RF power to the coil 104" can be set more independently of the DC biases to the target 110 and the target 310 in order to optimize plasma density for ionization purposes.

In addition, it is believed that the RF power levels for the coil 104" may be lower as compared to those for the coil 104. For example, a suitable power range for the coil 104" is 1.5 to 3.5 kW RF. The power ranges for the primary target 110 and the secondary target, i.e., the coil 310, are 2-5 kW DC and 1-3 kW DC, respectively. Of course, values will vary depending upon the particular application.

Figure 12:
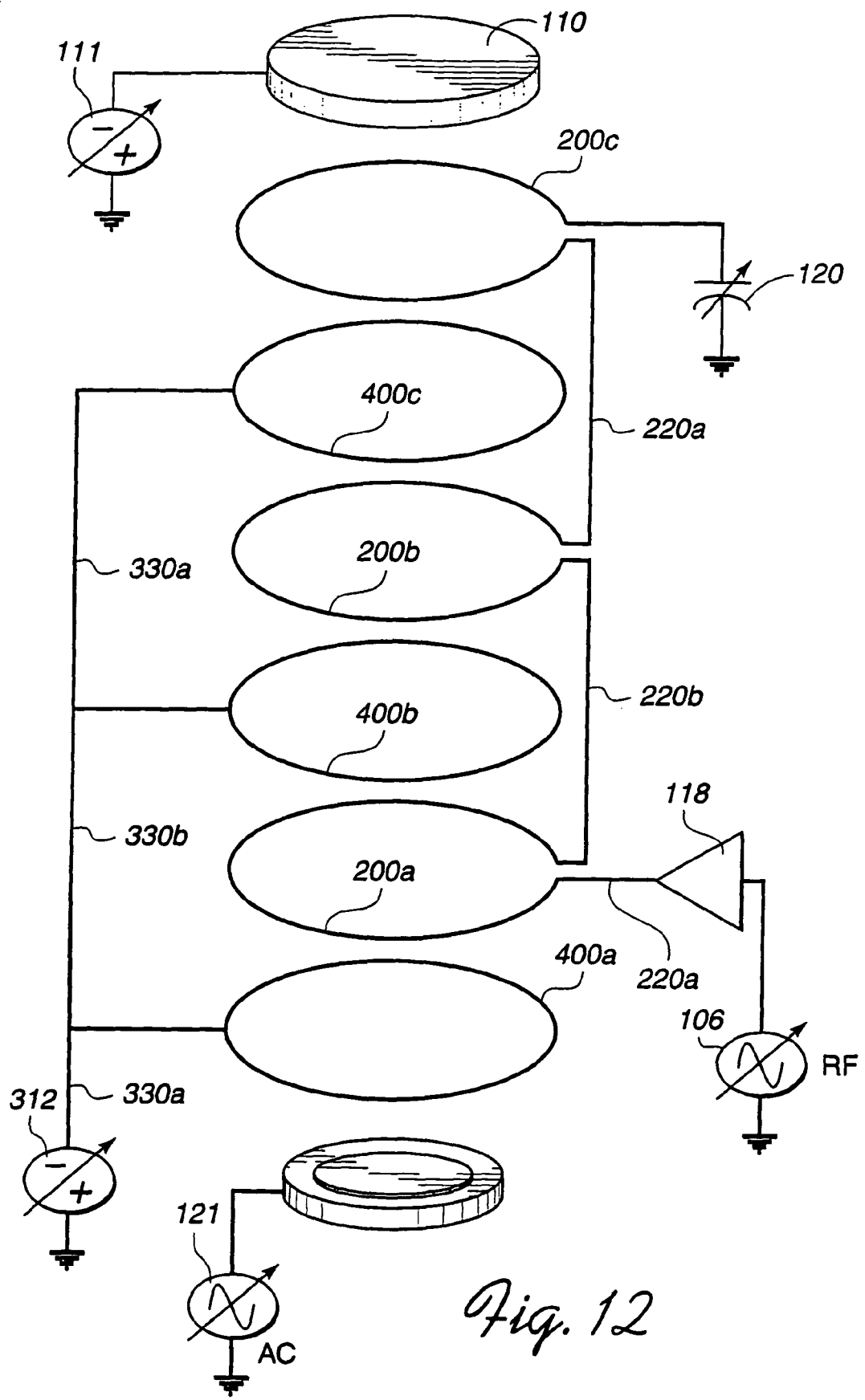
FIG. 12 is a schematic diagram of the electrical interconnections to the plasma generating chamber of FIG. 11.

FIGS. 11 and 12 show yet another alternative embodiment, which includes a multiple turn RF coil and a multiple ring secondary target in which the rings of the target are interleaved with the turns of the RF coil. The RF coil of FIG. 12, like the coil 104' of FIGS. 4-6, is formed of flat rings 200a-200c which are electrically connected together in series by RF feedthroughs which pass through the RF feedthrough standoffs 206a-206c and 208a-208c and external waveguides 220a-220d to the RF source and RF ground.

Interleaved with the coil rings 200a-200c of the RF coil are the closed rings 400a-400c of the second target. As schematically represented in FIGS. 11 and 12, the negatively biasing DC power source 312 external to the shield wall is coupled by an external strap 330a to a DC feedthrough in feedthrough standoff 206d to the lowest ring 400a of the second sputtering target. The target ring 400a is also coupled by the DC feedthrough in feedthrough standoff 206d to another external DC strap 330b which is coupled by the DC feedthrough in feedthrough standoff 206e to the middle target ring 400b. The target ring 400b is also coupled by the DC feedthrough in feedthrough standoff 206e to another external strap 330c which is coupled by the DC feedthrough in feedthrough standoff 206f to the top target ring 400c of sputtering secondary target.

Coupled together in this manner, it is seen that the target rings 400a-400c of the target 310' will be negatively DC biased so that the majority of the material sputtered from the RF coil and the secondary 400a-400c target will originate primarily from the target rings 400a-400c of the secondary target. Because the RF coil is a multiple turn coil, the current handling requirements of the feedthrough supports 206 and 208 can be substantially reduced as compared to those of the feedthrough supports 124 of the single turn coil 104 for a given RF power level as set forth above. In addition, it is believed that the life of the sputtering rings can be enhanced as a result of using multiple rings. Although the secondary sputtering targets 310 and 400a-400c have been described as being fabricated from flat rings 400, it should be appreciated that the sputtering secondary targets may be fabricated from ribbon and tubular materials as well as in a variety of other shapes and sizes including cylinders and segments of cylinders. However, it is preferred that the secondary targets be shaped so as to be symmetrical about the axis of the substrate and encircle the interior of the chamber at the periphery of the plasma. The secondary target material should be a solid, conductive material and may be of the same type or a different type of conductive material than that of the primary target 110. Although the biasing of the primary and secondary targets has been described as DC biasing, it should be appreciated that in some applications, AC or RF biasing of one or both of the primary and secondary targets may be appropriate.

A variety of precursor gases may be utilized to generate the plasma including Ar, $H_2$ or reactive gases such as $NF_3$, $CF_4$ and many others. Various precursor gas pressures are suitable including pressures of 0.1-50 mTorr. For ionized PVD, a pressure between 10 and 100 mTorr is preferred for best ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An RF coil for use with an RF generator for sputter deposition of a layer of coil material onto a substrate on a substrate support in a sputter deposition chamber having a target, said RF coil comprising:
   a ribbon-shaped member having first and second ends at least one of which is adapted to be coupled to the RF generator, and a cylindrically shaped target surface along the inner circumference of the member and comprising a sputterable deposition material, said member being adapted to be carried within said chamber so that said member target surface is positioned to sputter deposition material from said member target surface onto said substrate.

2. The coil of claim 1 wherein said member has a diameter sufficient to extend substantially around a space defined between said target and said substrate support.

3. The coil of claim 2 wherein said diameter is in a range of 10 to 12 inches.

4. The coil of claim 1 wherein said chamber has RF feedthrough standoffs and wherein each of the first and second ends is adapted to be coupled to an associated RF feedthrough standoff.

5. The coil of claim 1 wherein said sputterable deposition material is selected from the group of aluminum, titanium.

6. The coil of claim 1 wherein said member is a single turn coil.

7. The coil of claim 1 wherein said member has a height of ½ inch.

8. The coil of claim 7 wherein said member has a thickness of ⅛ inch.

9. The coil of claim 1 wherein said member has a height in excess of 2 inches.

10. The coil of claim 9 wherein said member is as thin as 1/16 inch.

11. A coil for use with an RF generator, for sputter deposition of a film layer onto a substrate in a vacuum chamber having a substrate support maintainable therein, a plasma generation area within said chamber, and a shield having a wall which substantially encircles said plasma generation area and said substrate support, and a first biasable target disposed in said chamber, the coil comprising:
   a sputterable coil member having a cylindrically shaped target surface along the inner circumference of the member and a first end adapted to be coupled to said RF generator and a second end adapted to be coupled to ground, said coil member being adapted to be insulatively carried by said wall, and to substantially encircle said plasma generation area so that said coil member target surface is positioned to couple energy inductively into said plasma generation area and positioned adjacent to said substrate support to sputter material from said coil member target surface onto said substrate.

12. The coil of claim 11 wherein said coil member is ribbon-shaped.

13. The coil of claim 11 wherein said member has a diameter sufficient to extend substantially around a space defined between said target and said substrate support.

14. The coil of claim 13 wherein said diameter is in a range of 10 to 12 inches.

15. The coil of claim 11 wherein said chamber has RF feedthrough standoffs and wherein said member has two ends, each of which is adapted to be coupled to an RF feedthrough standoff.

16. The coil of claim 11 wherein said sputterable deposition material is selected from the group of aluminum, titanium.

17. The coil of claim 11 wherein said member is a single turn coil.

18. The coil of claim 11 wherein said member has a height of ½ inch.

19. The coil of claim 18 wherein said member has a thickness of ⅛ inch.

20. The coil of claim 11 wherein said member has a height in excess of 2 inches.

21. The coil of claim 20 wherein said member is as thin as 1/16 inch.

22. The coil of claim 11 wherein said target and said coil member are each formed of the same material adapted to be sputtered onto said substrate.

23. A coil for use with an RF generator, for sputter deposition of a film layer onto a substrate in a vacuum chamber having RF feedthrough standoffs, a substrate support maintainable therein, a plasma generation area within said chamber, a shield having a wall which substantially encircles said plasma generation area and said substrate support, and a first biasable target disposed in said chamber, the coil comprising:
   a sputterable, single turn, solid deposition material, ribbon-shaped coil member having a cylindrically shaped target surface along the inner circumference of the member and a thickness of 1/16-⅛ inch wherein said target and said coil member are each formed of the same sputterable deposition material adapted to be sputtered onto said substrate wherein having sputterable deposition material is selected from the group of aluminum, titanium, said coil member having a first end adapted to be coupled to said RF generator via an RF feedthrough standoff, and a second end adapted to be coupled to ground via an RF feedthrough standoff, said coil member being adapted to be insulatively carried by said wall, and having a diameter in a range of 10 to 12 inches sufficient to extend substantially around a space defined between said target and said substrate support and to substantially encircle said plasma generation area so that said coil member target surface is positioned to couple energy inductively into said plasma generation area and positioned adjacent to said substrate support to sputter material from said coil member target surface onto said substrate.

24. The coil of claim 1 wherein said ribbon-shaped member is a solid ribbon of sputterable deposition material.

25. The coil of claim 12 wherein said coil member is a solid ribbon of sputterable deposition material.

* * * * *